US006965528B2

(12) United States Patent
Lee et al.

(10) Patent No.: US 6,965,528 B2
(45) Date of Patent: Nov. 15, 2005

(54) MEMORY DEVICE HAVING HIGH BUS EFFICIENCY OF NETWORK, OPERATING METHOD OF THE SAME, AND MEMORY SYSTEM INCLUDING THE SAME

(75) Inventors: Jae-Hyeong Lee, Kyunggi-do (KR); Jung-Bae Lee, Kyunggi-do (KR); Dong-Yang Lee, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 151 days.

(21) Appl. No.: 10/641,637

(22) Filed: Aug. 14, 2003

(65) Prior Publication Data

US 2004/0062087 A1 Apr. 1, 2004

(30) Foreign Application Priority Data

Oct. 1, 2002 (KR) ..................... 10-2002-0059836

(51) Int. Cl.$^{7}$ ................................................ G11C 7/00
(52) U.S. Cl. ............................ 365/189.04; 365/189.01
(58) Field of Search ...................... 365/189.04, 189.01, 365/198

(56) References Cited

U.S. PATENT DOCUMENTS

| | | | | |
|---|---|---|---|---|
| 5,548,774 | A * | 8/1996 | Maurel | 710/265 |
| 6,317,639 | B1 * | 11/2001 | Hansen | 700/83 |
| 6,898,726 | B1 * | 5/2005 | Lee | 713/503 |
| 2001/0034805 | A1 * | 10/2001 | Usui et al. | 710/129 |

* cited by examiner

*Primary Examiner*—Vu A. Le
(74) *Attorney, Agent, or Firm*—Marger Johnson & McCollom, P.C.

(57) ABSTRACT

A memory device having a high bus efficiency on a network, an operating method of the memory device, and a memory system including the memory device are provided. The memory device includes banks, a programming register, and a controller. Each of the banks has a plurality of memory cells arranged in a matrix of rows and columns. In a write operation, the programming register stores simultaneous write information on how many banks there are in which data are stored. In a read operation, the controller selects one of the banks subjected to the write operation in response to the simultaneous write information to read out the memory cell data in the selected bank.

10 Claims, 7 Drawing Sheets

MEMORY DEVICE HAVING HIGH BUS EFFICIENCY OF NETWORK, OPERATING METHOD OF THE SAME, AND MEMORY SYSTEM INCLUDING THE SAME

FIELD OF THE INVENTION

The present invention a semiconductor memory device and, more particularly, to a memory device having a high bus efficiency in a network system.

BACKGROUND OF THE INVENTION

DRAM (dynamic random access memory) is a memory, which transmits or receives a digital signal through a bus according to the requirement of a central processing unit (CPU) in a system. Under the standpoint of signal (bit) transmission, the DRAM is focused on the optimization of electric signal transmission such as a data width or driving force of a data output buffer. Namely, there is a demand for speedy and precise with regard to signal-to-noise ration (S/N ratio), signal transmission according to the requirement of the CPU. However, as the DRAM has been applied to a network system, speedy and precise "information" transmission becomes more important than speedy and precise "signal" transmission. Under the standpoint of information transmission, there is a demand for smooth data transmission between the DRAM and transmission objects. Accordingly, many efforts have been made for enhancing transmission efficiency without idle time on a bus.

A conventional DDR (double data rate) DRAM is now described below with reference to FIG. 1.

Referring to FIG. 1, a DDR DRAM 100 transmits address signals ADD to a bank selecting unit 120, a row buffer 130, and a column buffer 140 in response to a clock signal CLK inputted from an address register 110. An output of the bank selecting unit 120 and an output of the row buffer 130 are decoded by a row decoder 150, and an output of a column buffer is decoded by a column decoder 160. In a memory block 170 having a plurality of banks, memory cells corresponding to a wordline activated by the row decoder 150 and a bitline activated by the column decoder 160 are selected. In a write operation, data DQi inputted to a data input register 230 is written to selected memory cells. In a read operation, data of the selected memory cells are outputted to the data input/output signal DQi through a sense amplifier (S/A) 180 and an output buffer 220. The outputted data input/output signal DQi may be variously embodied with latency information and burst length information 210. The latency information and the burst length information are stored in a programming register 200 according to the inputted clock signal CLK and a plurality of control signals CKE, /CS, /RAS, /CAS, and /WE, through the timing register 190.

The operation of the DDR DRAM 100 is now described with reference to FIG. 2. For the convenience, the DDR DRAM 100 is described under the example that a row clock cycle (tRC) is set to 10 clock cycles (10*tCK), an /RAS to /CAS delay time (tRCD) is set to 3 clock cycles (3*tCK), and a CAS latency (CL) is set to 3.

Referring to FIG. 2, a first active row command A0 is inputted at a clock 0. After tRCD time elapses from the clock 0, a read command R0 relative to a first active low state is inputted at a clock 3. After a clock cycle corresponding to "CL=3", first data Q0 is outputted to a data input/output signal DQi at a clock 6. A second active row command A1 is inputted at a clock 10 which is reached from the clock 0 after tRC time elapses. A read command R1 relative to a second active low state is inputted to a clock 13 which is reached from the clock 0 after tRCD time elapses. After the clock cycle corresponding to "CL=3", second data Q1 is outputted at a clock 16.

If a network system is realized by applying such a DDR DRAM with trend toward the high speed of a communication apparatus, data access time is shortened to shorten data transmission time. Thus, a high-speed operation can be achieved. Under the standpoint of the network system, it is expected that data transmitted through bus lines in the system will be transmitted without suspension or idle time, i.e., a high bus efficiency will be achieved.

In view of the foregoing operation timing of the DDR DRAM (100 of FIG. 1), bus efficiency between first data Q0 and second Q1 loaded on the data input/output signal DQ1 is merely 20% (i.e., the first data Q0 is loaded only on two clocks out of ten clocks). Since only one access is possible for one tRC time, the amount of data transmitted per unit time is reduced. Therefore, the DDR DRAM is not suitable for the network system.

SUMMARY OF THE INVENTION

An embodiment of the present invention provides a memory device including banks, a programming register, and a controller. Each of the banks has a plurality of memory cells arranged in a matrix of rows and columns. In a write operation, the programming register stores simultaneous write information on how many banks there are in which data are stored. In a read operation, the controller selects one of the banks subjected to the write operation in response to the simultaneous write information to read out the memory cell data in the selected bank.

Another embodiment of the present invention provides an operating method of a memory device for detecting data by selecting one of banks to which the same data is written. The operating method includes storing simultaneous write signal to indicate how many banks there are in which data are stored, in a write operation; performing a write operation to corresponding banks in response to the simultaneous write signal; selecting one of banks subjected to the write operation to perform a read operation and to store information on a read-out bank in a bank state storing unit; and selecting another bank instead of the read-out bank in the next read operation to perform the read operation. The simultaneous write signal is stored in a mode register of the memory device.

In accordance with still another embodiment, the present invention provides a memory system having N ($N \geqq 2$, N being an integer) memory devices. The memory system includes N memory devices each of which are selected by a first chip selection signal or N chip selection signals and performs a write operation and a read operation, and a memory controller for simultaneously instructing the write operation to corresponding memory devices by enabling two or more chip selection signals among the first chip selection signal or the N chip selection signals in the write operation and for individually instructing read operations of the corresponding banks by individually enabling the first chip selection signal or the N chip selection signals of the corresponding banks in the read operation.

DESCRIPTION OF THE PREFERRED EMBODIMENT

A memory device according to the present invention is now described with reference to FIG. 3.

Figure 1:
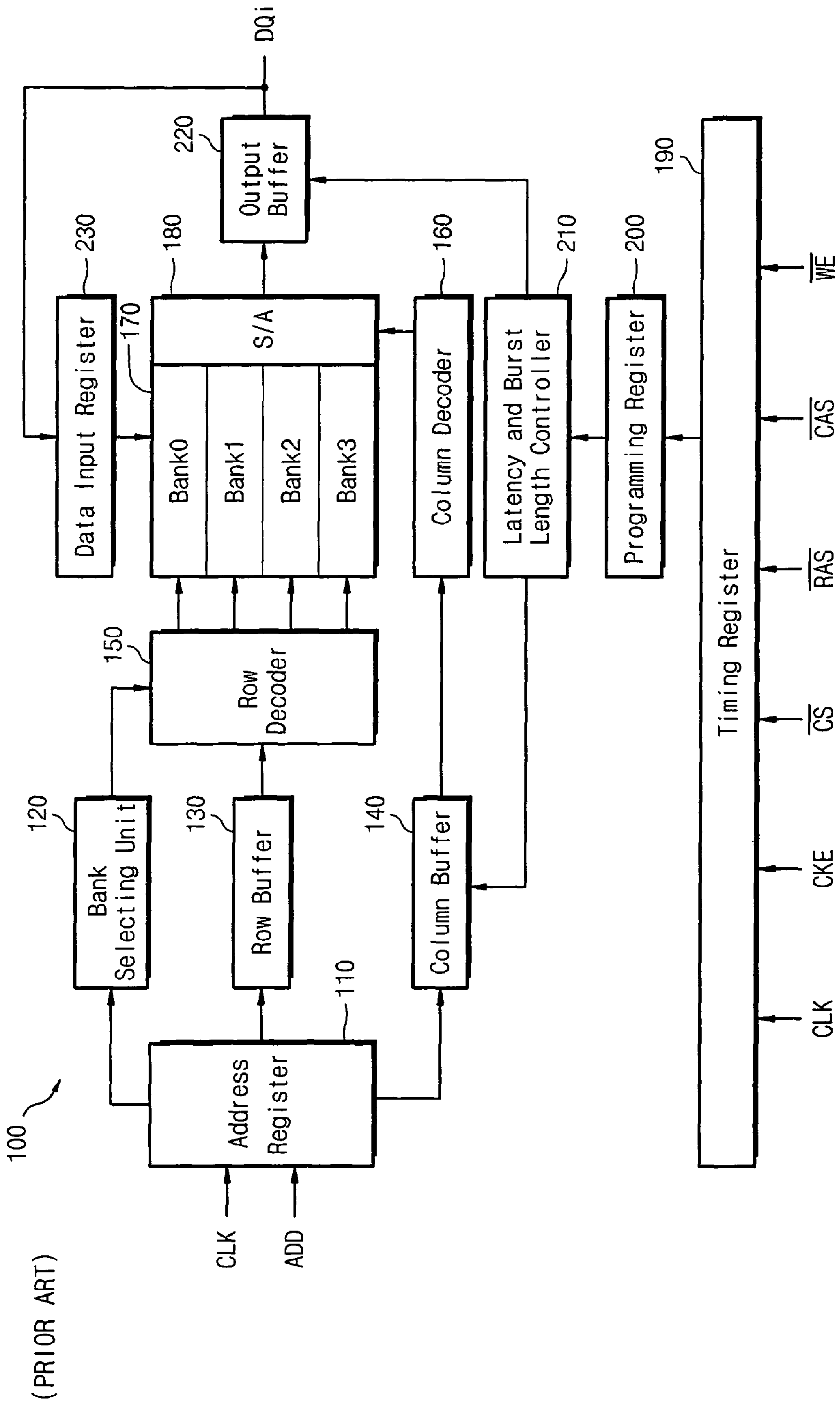
FIG. 1 is a block diagram of a conventional DDR DRAM.
Figure 3:
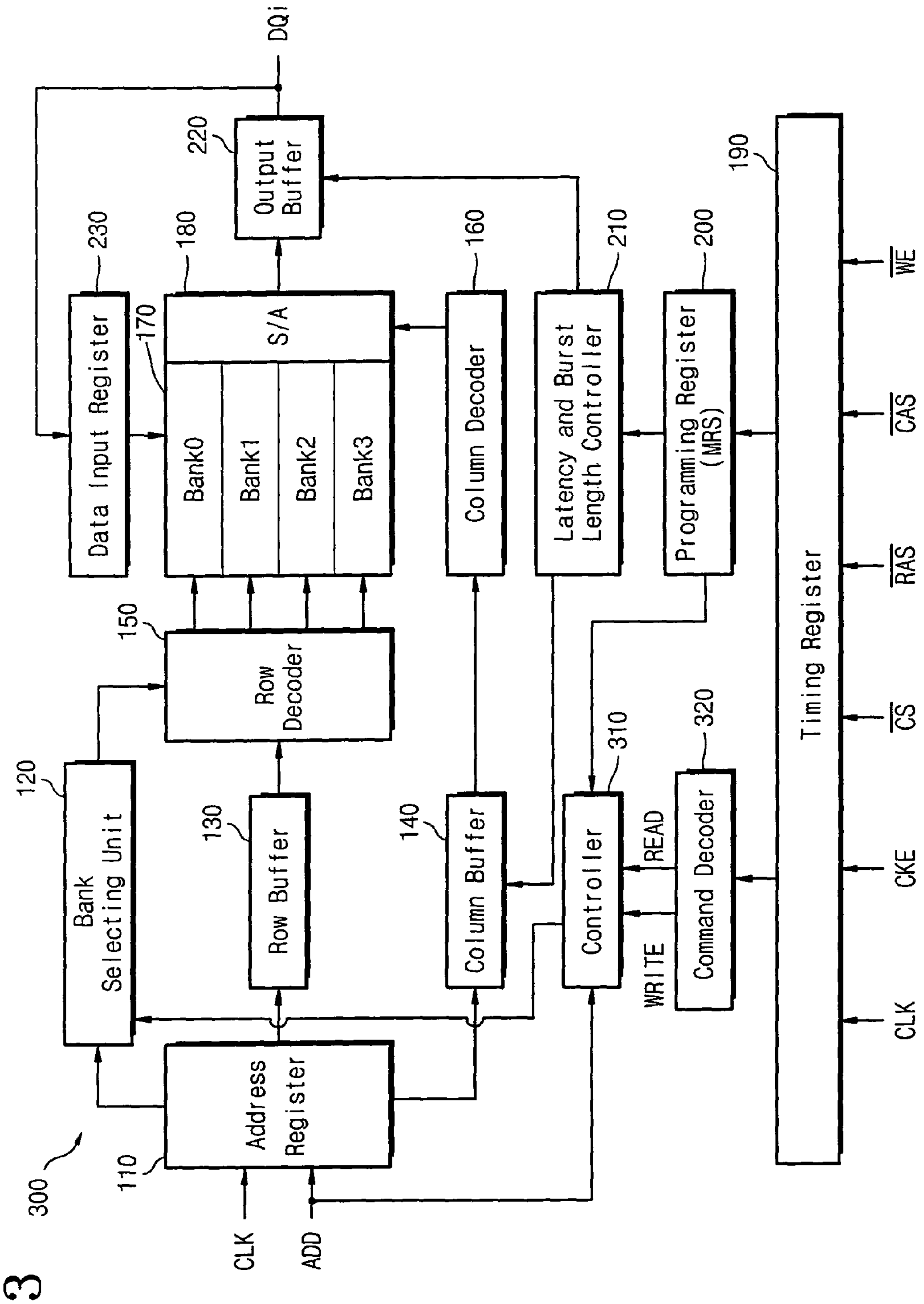
FIG. 3 is a block diagram of a memory device according to an embodiment of the present invention.

Referring to FIG. 3, a memory device 300 includes an address register 110, a bank selecting unit 120, a row buffer 130, a column buffer 140, a row decoder 150, a column decoder 160, a plurality of banks 170, a sense amplifier (S/A) 180, a data input register 230, a timing register 190, a programming register 200, a latency and burst length controller 210, and an output buffer 220, which is similar to the memory device 100 of FIG. 1. But the memory device 300 further includes a controller 310 and a command decoder 320, which is different from the memory device 100 of FIG. 1. The programming register 200 stores simultaneous write information. The command decoder 320 generates a write signal WRITE and a read signal READ by means of the combination of control signals CLK, CKE, /CS, /RAS, /CAS, and /WE which are inputted to the timing register 190.

The controller 310 is now explained below in detail with reference to FIG. 4.

Figure 4:
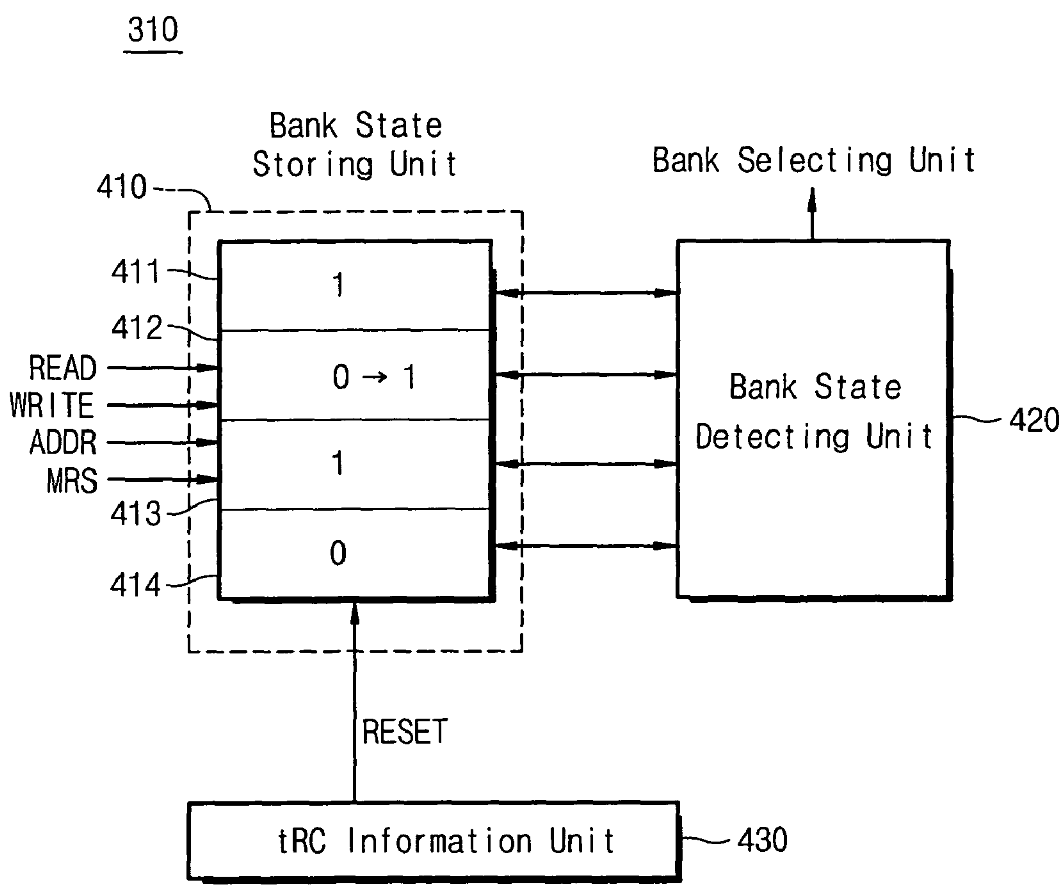
FIG. 4 is a block diagram of a control logic in the memory device of FIG. 3.

Referring to FIG. 4, the controller 310 includes a bank state storing unit 410, a bank state detecting unit 420, and a tRC information unit 430. The bank state storing unit 410 has a plurality of registers. In this embodiment, the bank state storing unit 410 has four registers 411, 412, 413, and 414. The bank state storing unit 410 stores information on a currently used bank in response to an address signal ADD, a read signal READ, and a programming register MRS. After performing a write operation to corresponding banks in response to simultaneous write information stored in the programming register MRS, the bank state storing unit 410 initializes registers 411, 412, 413, and 414 corresponding to the banks to a state "0". When the address signal ADD selects a first bank BANK0 in the read operation, the first register 411 in the bank state storing unit 410 is stored with a state "1". When the address signal ADD selects a third bank BANK2 in the next read operation, the third register 413 in the bank state storing unit 410 is stored with a state "1".

The bank state detecting unit 420 monitors values of the registers 411, 412, 413, and 414 in the bank state storing unit 410 and detects whether the address signal ADD inputted together with a current read operation selects banks used in a previous read command, e.g., the first bank BANK0 or the third bank BANK2. If a currently inputted address signal ADD selects the first bank BANK0 used in the previous read command, the bank sate detecting unit 420 allows the bank selecting unit (120 of FIG. 3) to operate such that the second bank BANK1 or the fourth bank BANK3 unused in the previous read command is selected. Further, if a currently selected bank is determined to be the second bank BANK1, the bank state detecting unit 420 changes a value "0" of the second register 412 in the bank state storing unit 410 into a value "0".

The tRC information unit 430 generates a reset signal RESET whenever a clock cycle of a row cycle time (tRC) provision passes, resetting the registers 411, 412, 413, and 414 in the bank state storing unit 410 to a value "0". After performing a write operation to corresponding banks in response to the simultaneous write signal stored in the programming register MRS, the tRC information unit 430 resets the registers 411, 412, 413, and 414 corresponding to the banks to a value "0".

Figure 2:
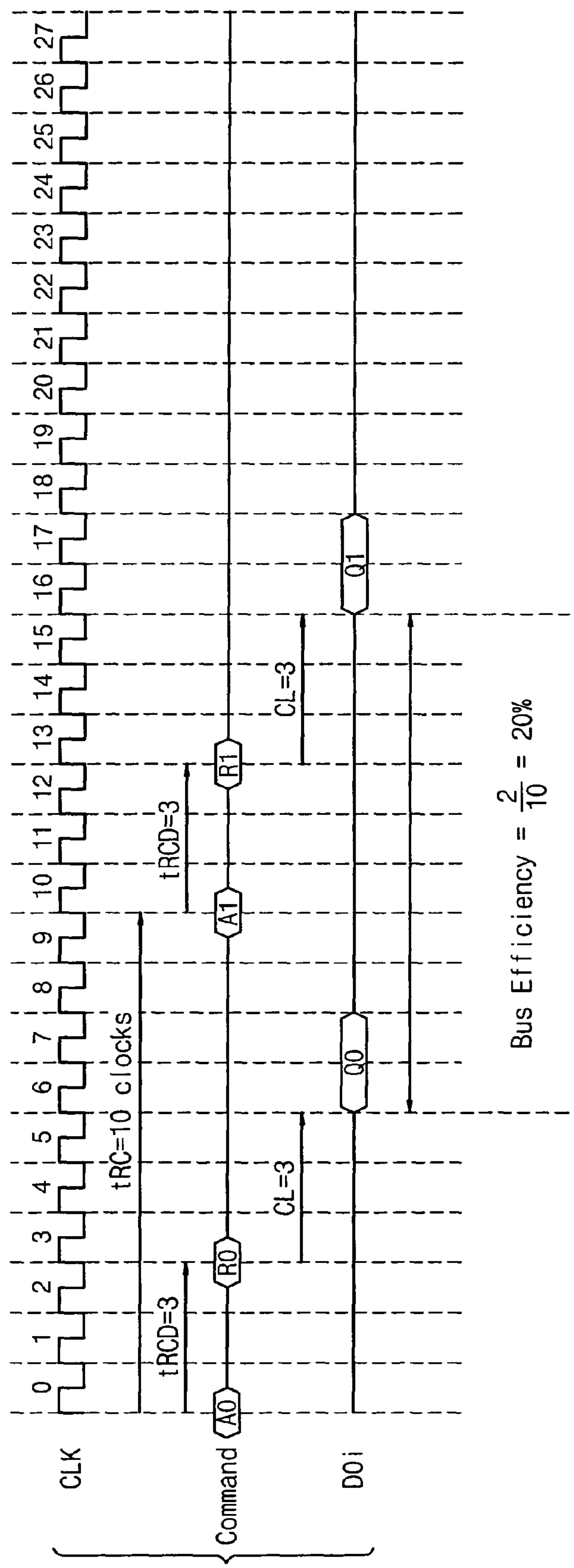
FIG. 2 is a timing diagram of the DDR DRAM of FIG. 1.

A read operation timing of the memory device 300 of FIG. 3 is now described below with reference to FIG. 5. As previously stated in FIG. 2, the tRC time is set to 10 clock cycles (10*tCK), the tRCD time is set to 3 clock cycles (3*tCK), and the CL is set to 3.

Figure 5:
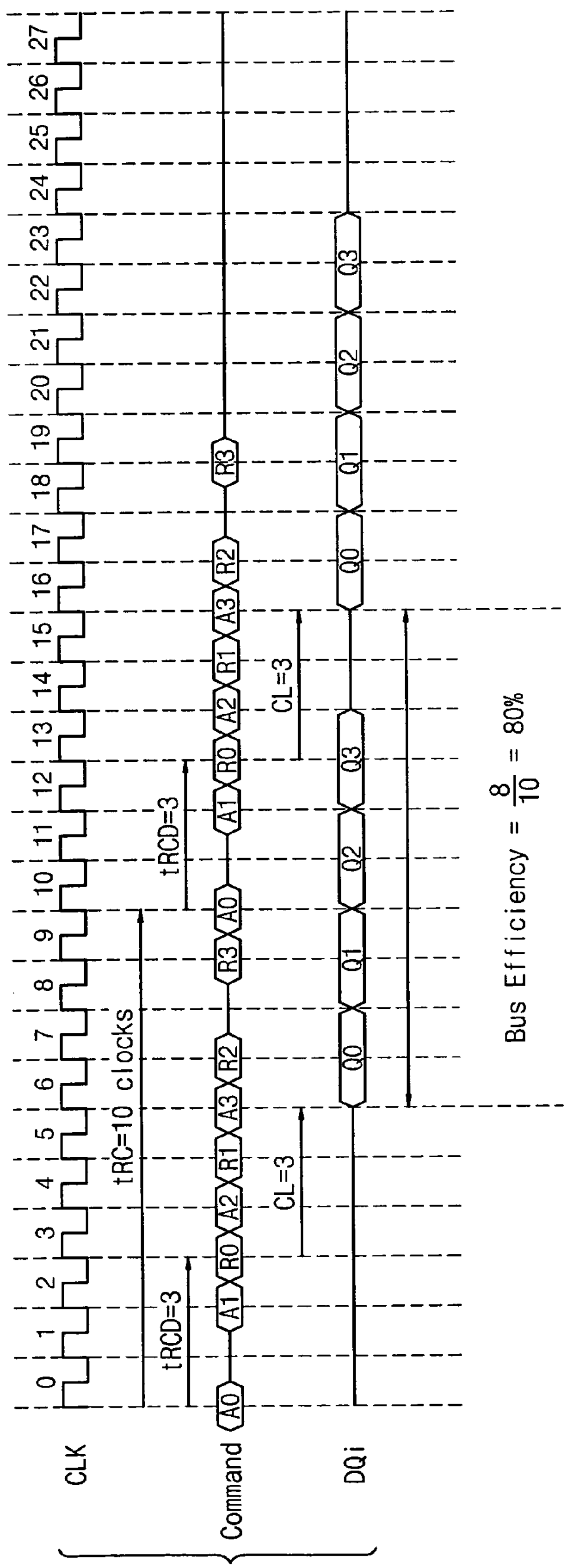
FIG. 5 is a timing diagram of the memory device of FIG. 3.

Referring to FIG. 5, during a first row cycle tRC, a first active low command A0 is inputted at a clock 0. After the tRCD time elapses, a first read command R0 relative to a first active low state is inputted at a clock 3. A second active low command A1 is inputted at a clock 2. After the tRCD time elapses, a second read command R1 relative to a second active low state is inputted. After the tRCD time elapses from a clock 4 at which a third active low command A2 is inputted, a third read command R2 relative to a third active low state is inputted at a clock 7. After the tRCD time elapses from a clock 6 at which a fourth active command A3 is inputted, a fourth read command R3 relative to a fourth active low state is inputted at a clock 9.

After a clock cycle corresponding to "CL=3" passes from the clock 3 at which the first read command R0 is inputted, first data Q0 is outputted to a data input/output signal DQi line at the clock 6. After the clock cycle corresponding to "CL=3" passes from the clock 5 at which the second read command R1 is inputted, second data Q1 is outputted at a clock 8. After the clock cycle corresponding to "CL=3" passes from the clock 7 at which the third read command R2 is inputted, third data Q2 is outputted at a clock 10. After the clock cycle corresponding to "CL=3" passes from the clock 9 at which the fourth read command R3 is inputted, fourth data Q3 is outputted at a clock 12.

The first to fourth data Q0, Q1, Q2, and Q3 may be outputted with various bits (e.g., ×4,×8,×16,×32, etc.) according to the input/output configuration of the memory device 300. They may be sequentially generated under the interval of tRRD (row active to row active delay) time. The tRRD time is a minimum time provision for preventing an error caused by the power level fluctuation that results from the operation of a sense amplifier. In the timing diagram of FIG. 5, an example is described that the tRRD time is set to about 2 clock cycle.

A second row cycle tRC is substantially identical with the first row cycle tRC from the clock 10 and will not be explained in further detail.

Now, the data input/output line DQi of the memory device (300 of FIG. 3) having the above operation timing is described. At eight clocks, among ten clocks, the first to fourth data Q0, Q1, Q2, and Q3 are loaded, i.e., a bus efficiency is 80%. This means that the bus efficiency is much higher than the conventional bus efficiency (20%). Data can be loaded each clock according to the CL value or the tRCD time provision, which enables the bus efficiency to rises up to nearly 100%.

Since the four banks BANK0, BANK1, BANK2, and BANK3 are simultaneously written in a write operation, a usable memory capacity of the memory device (300 of FIG. 3) is lowered to be ¼ of the original capacity. But a communication network is great favorite with a higher bus efficiency function, so that the memory device (300 of FIG. 3) is unsuitable for a network DRAM used in the communication network.

A memory system according to the present invention is now described with reference to FIG. 6.

Figure 6:
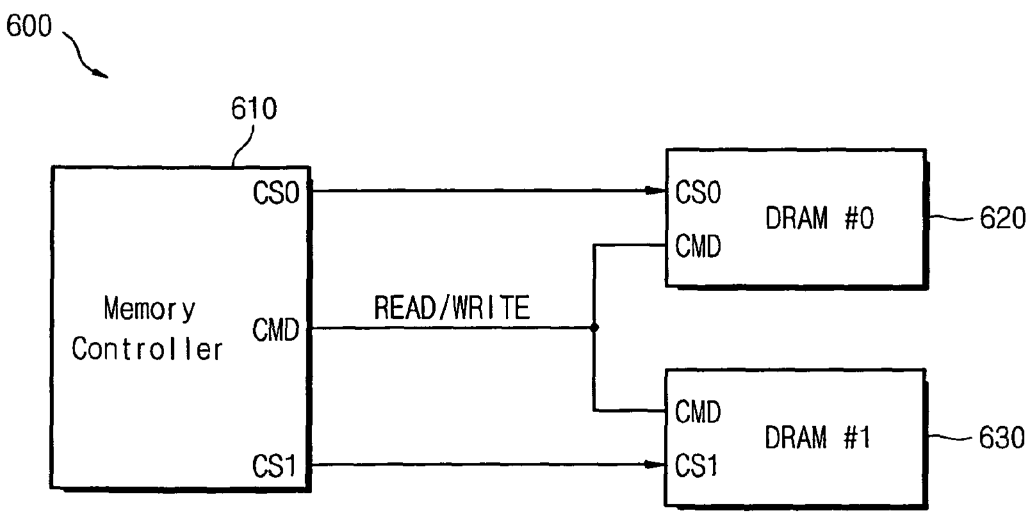
FIG. 6 is a block diagram of a memory system according to another embodiment of the present invention.

Referring to FIG. 6, a memory system 600 includes a memory controller 610, a first memory device 620, and a second memory device 630. The memory controller 610 generates a first chip selection signal CS0 and a second chip selection signal CS1 to select the first memory device 620 and the second memory device 630. Operation modes of the first and second memory devices 620 and 630 are determined depending on a command CMD (e.g., READ or WRITE) generated from the memory controller 610.

An operation timing of the memory system 600 is now described with reference to FIG. 7.

Figure 7:
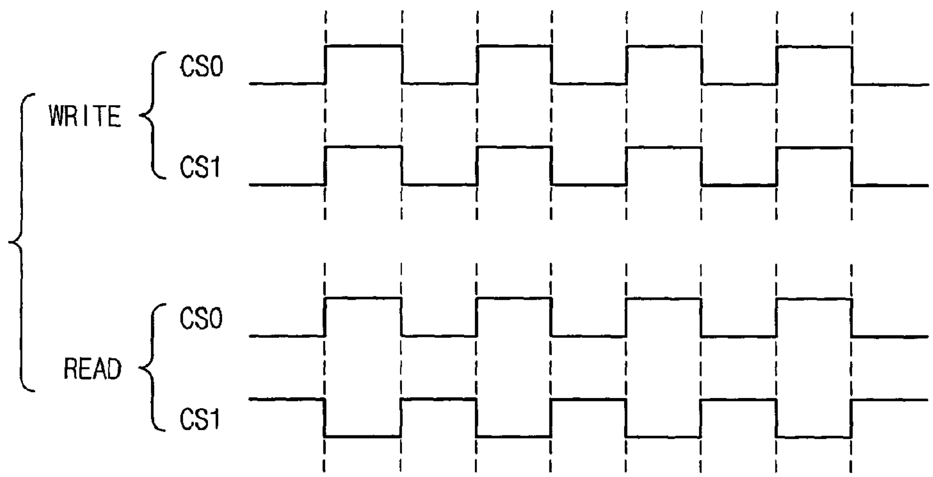
FIG. 7 is a timing diagram of the memory system of FIG. 6.

Referring to FIG. 7, the memory controller 610 enables the first and second chip selection signals CS0 and CS1 together with the write command WRITE to select the first and second memory devices 620 and 630. Thus, the same data is simultaneously written to the first and second memory devices 620 and 630 in the write operation. Afterwards, the memory controller 610 oppositely activates the first and second chip selection signals CS0 and CS1 relative to the read command READ. As a result, data outputted from the first and second memory devices 620 and 630 are successively outputted to a data bus line (not shown).

Although a memory system having two memory devices has been described, it will be understood that the present invention may be applied to a memory system having three or more memory devices. Therefore, a memory controller enables two or more memory devices in a write operation to simultaneously instruct a write operation to corresponding memory devices, and individually enables corresponding banks simultaneously written in a read operation to instruct a read operation of the corresponding banks.

Figure 8:
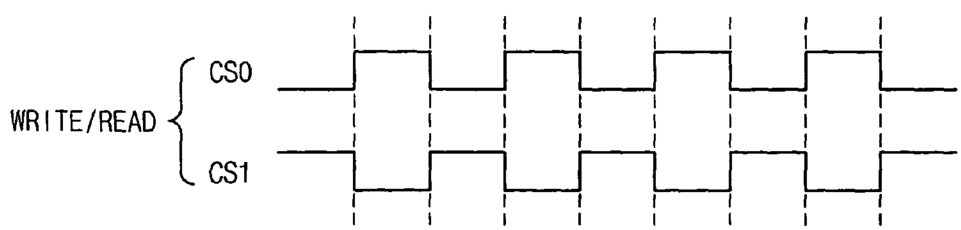
FIG. 8 is a timing diagram of a conventional memory system in order to be compared with the timing diagram of FIG. 7.

As compared to the timing diagram of FIG. 7, a timing diagram of a conventional memory system is illustrated in FIG. 8.

Referring to FIG. 8, a first chip selection chip CS0 and a second chip selection chip CS1 are oppositely activated relative to a write command WRITE and a read command READ. Whenever the first memory device 620 or the second memory device 630 is selected by the first chip selection signal CS0 or the second chip selection signal CS1, a data write or read operation is carried out. Accordingly, data outputted to a data bus line are not successive.

As a result, the memory system (600 of FIG. 6) having the operation timing of FIG. 7 is also suitable for a network system requiring a high bus efficiency.

According to the present invention, after a write operation to predetermined banks in a memory device, a read operation is carried out from these banks to successively output data. Therefore, the memory device is suitable for a network system. While the present invention has been particularly shown and described with reference to preferred embodiments thereof, it will be understood by a person skilled in the art that the foregoing and other changes in form and details can be made therein without departing from the spirit and scope of the invention.

What is claimed is:

1. A memory device comprising:

memory banks each having a plurality of memory cells arranged in a matrix of rows and columns;

a programming register to store simultaneous write information on how many banks there are in which data are stored, in a write operation; and a controller to select one of the banks subjected to the write operation in response to the simultaneous write information to read out the memory cell data in the selected bank, in a read operation.

2. The memory device of claim 1, the controller further comprising:

a bank state storing unit to store information on a bank selected by address signals inputted to the memory device, in the read operation; and a bank state detecting unit to detect the information of the bank state storing unit and selecting another bank instead of the selected bank to perform a read operation and for transmitting the information on the selected another bank to the bank state storing unit.

3. The memory device of claim 2, the controller further to perform the write operation to corresponding banks in response to the simultaneous write information and then resets the bank state storing unit.

4. The memory device of claim 2, the controller further comprising a tRC information unit to reset the bank state storing unit whenever a clock cycle of a row cycle time provision of the memory device passes.

5. The memory device of claim 1, the programming register further comprising a mode register in the memory device.

6. An operating method of a memory device for detecting data by selecting one of banks to which the same data is written, the operating method comprising:

storing simultaneous write signal to indicate how many banks there are in which data are stored, in a write operation;

performing a write operation to corresponding banks in response to the simultaneous write signal;

selecting one of banks subjected to the write operation to perform a read operation and to store information on a read-out bank in a bank state storing unit; and selecting another bank instead of the read-out bank in the next read operation to perform the read operation.

7. The operating method of claim 6, further comprising resetting the bank state storing unit corresponding to the banks after performing the write operation to the corresponding banks in response to the simultaneous write information.

8. The operating method of claim 6, further comprising resetting the bank state storing unit whenever a clock cycle of a row cycle time provision of the memory device passes.

9. The operating method of claim 6, storing the simultaneous write signal further comprising storing the simultaneous write signal in a mode register of the memory device.

10. A memory controller, comprising:

a bank state storing unit to store information on a bank selected by address signals inputted to a memory device; and a bank state detecting unit to detect information of the bank state storing unit and to select a bank other than the selected bank upon which to perform a read operation and to transmit the information on the other bank to the bank state storing unit.

* * * * *